United States Patent [19]

Jackson et al.

[11] Patent Number: 4,583,110
[45] Date of Patent: Apr. 15, 1986

[54] INTERMETALLIC SEMICONDUCTOR OHMIC CONTACT

[75] Inventors: Thomas N. Jackson, Peekskill; Peter D. Kirchner, Garrison; George D. Pettit, Mahopac; Jerry M. P. Woodall, Bedford Hills, all of N.Y.

[73] Assignee: International Business Machines Corporation, Armonk, N.Y.

[21] Appl. No.: 620,591

[22] Filed: Jun. 14, 1984

[51] Int. Cl.$^4$ .................... H01L 23/48; H01L 29/167
[52] U.S. Cl. ......................................... 357/65; 357/63
[58] Field of Search ..................................... 357/63, 65

[56] References Cited

U.S. PATENT DOCUMENTS

| | | | |
|---|---|---|---|
| 3,914,785 | 10/1975 | Ketchow | 357/63 |
| 3,959,036 | 5/1976 | Ketchow | 148/171 |
| 3,984,261 | 10/1976 | Hawrylo | 148/33 |
| 3,987,480 | 10/1976 | Diguet et al. | 357/65 |
| 4,011,583 | 3/1977 | Levinstein et al. | 357/67 |
| 4,024,569 | 5/1977 | Haurylo | 357/63 X |
| 4,188,710 | 2/1980 | Davey et al. | 29/580 |
| 4,223,336 | 9/1980 | Thompson | 357/63 |
| 4,414,561 | 11/1983 | Keramidas | 357/65 X |
| 4,426,765 | 1/1984 | Shahriary et al. | 29/571 |

OTHER PUBLICATIONS

Barnes et al., *Appl. Phys. Lett.*, vol. 33, No. 7, Oct. 1, 1978, pp. 651–653.
J. Appl. Phys. 50(2), Feb. 1979, pp. 951–954, "Nonalloyed and in situ Ohmic Contacts to Highly Doped N-Type GaAs Layers Grown by Molecular Beam Epitaxy (MBE) for Field-Effect Transistors" by DiLorenzo et al.
U.S. patent application Ser. No. 411,114, filed Aug. 24, 1982, by Woodall.
J. Vac. Sci. Technol., 19(3), Sep./Oct. 1981, p. 803—'Alloyed Ohmic Contacts to GaAs" by N. Braslau.
Solid State Electronics, Pergamon Press 1971, vol. 14, pp. 541–550—"Specific Contact Resistance of Metal-Semiconductor Barriers" by C. Y. Chang et al.
J. Phys. Chem. Solids, Pergamon Press 1971, vol. 32, pp. 571–580—"Influence of Surface Band Bending on the Incorporation etc." by H. C. Casey, Jr. et al.
Appl. Phys. Lett., vol. 37, No. 2, Jul. 15, 1980, pp. 165–167, "Dependence of the Electrical Characteristics of Heavily Ge-Doped GaAs etc." by Metze et al.
Appl. Phys. Lett., vol. 39, No. 10, Nov. 15, 1981, pp. 800–803, "The Effect of Growth Conditions on Si Incorporation in Molecular Beam etc." by Chai et al.
Appl. Phys. Lett., vol. 33, No. 7, Oct. 1, 1978, pp. 651–653, "Nonalloyed Ohmic Contacts to n-GaAs by Molecular Beam Epitaxy" by Barnes et al.

*Primary Examiner*—Martin H. Edlow
*Attorney, Agent, or Firm*—Alvin J. Riddles

[57] ABSTRACT

A $10^{-6}$ ohm cm$^2$ ohmic contact is provided by formation of a 20–50 Angstroms deep surface region with a net donor density of higher than $5 \times 10^{19}$/cc. An amphoteric dopant of Si or Ge is incorporated in a pinned Fermi level condition so that an enhanced surface donor concentration occurs.

7 Claims, 2 Drawing Figures

INTERMETALLIC SEMICONDUCTOR OHMIC CONTACT

DESCRIPTION

1. Technical Field

The technical field of the invention is that of external contacts to intermetallic or multi-element semiconductor devices. At the present state of the art, the multi-element or intermetallic type semiconductors have a number of advantages and as a result are receiving attention in the art. However, one major impediment to the practice of this technology is that ohmic contacts, where a metal external circuit electrode is placed on the surface of the semiconductor, involve barriers to carrier flow that are inherent in the device technology and which introduce resistance that can be a significant inhibitor to device performance.

2. Background Art

The presence of such a barrier to current flow at the surface of an intermetallic semiconductor has been recognized in the art and there have been efforts to improve the problem.

At this point in the art, most contacts involve alloying operations or the introduction of an interlayer between the contact and the intermetallic crystal. Of the alloy type contacts, one involves gold and germanium to n type GaAs, as described in J. Vac. Sci. Tech. 19, 3, Sept./Oct. 1981, p.803. These contacts have the problem of thermal stability and reproducibility. The other type contact involves an interlayer between the metal and the crystal. Such a contact is described in copending application Ser. No. 411,114 filed Aug. 24, 1982.

The major driving force for ohmic contact technology is for large scale integration which requires low resistance, dimensional stability and stability under high temperature processing.

One major disadvantage attendant with the techniques employed thus far in the art has been the fact that the final metal application in the processes involves heat either to fuse the metal or to repair crystal damage and in turn that heat tends to produce other problems such as the lack of dimensional and thermal stability control needed for large scale integration applications. In an effort to address this situation, ohmic contacts to GaAs using a donor concentration of $6 \times 10^{19}$/cc of Sn throughout the crystal bulk are reported in Appl. Phys. Lett., 33, 7, Oct. 1, 78, p.651. It was later found and reported in J. Appl. Phys. 50, 2, February 1979, p.951 that the element Sn as incorporated by the technique of molecular beam eptiaxy has a disadvantage in these concentrations in the form of a surface that is too rough for device use.

DISCLOSURE OF THE INVENTION

In accordance with the invention an amphoteric dopant is caused to exhibit significant donor performance rather than acceptor performance in a narrow surface region of an intermetallic crystal in a distance that is of the order of the depletion width, and an ohmic contact with a very low resistivity, of the order of $10^{-6}$ ohm centimeters squared can be fabricated by applying a metal without thermal fusing.

The amphoteric nature of the dopant permits it to reside on different sublattices of the intermetallic crystal. Performance as an acceptor or a donor is determined by which of the sublattice positions the dopant occupies, which in turn is determined by the free carrier concentration and sublattice vacancy concentration.

In accordance with the invention, enhanced donor performance of amphoteric dopants may be accomplished using the technique of molecular beam epitaxy. If the anion vapor pressure and the separation of the conduction band at the surface and surface Fermi level are sufficiently large, the dopant atoms in the surface region will exhibit a donor site selection sufficient to form low resistance ohmic contacts even though the electron concentration in the bulk of the crystal may be lower.

The ohmic contact is made to the surface region where the concentration of the dopant atoms on donor sites minus the concentration of dopant atoms on acceptor sites is very high above $5 \times 10^{19}$/cc.

In the tunneling barrier type ohmic contact performance improves exponentially with reduced tunneling distance. Most non-fused tunneling barrier contacts currently in the art are made to material with a net donor density of less than $2 \times 10^{19}$/cc and have depletion distances of 100 Angstroms or more. The tunneling distance in this invention is 20 to 50 Angstroms and is otherwise very difficult to achieve.

The ohmic contact of the invention may be contrasted with other ohmic contacts in that the metal is on the crystal surface with no interlayer or fusing.

Figure 1:
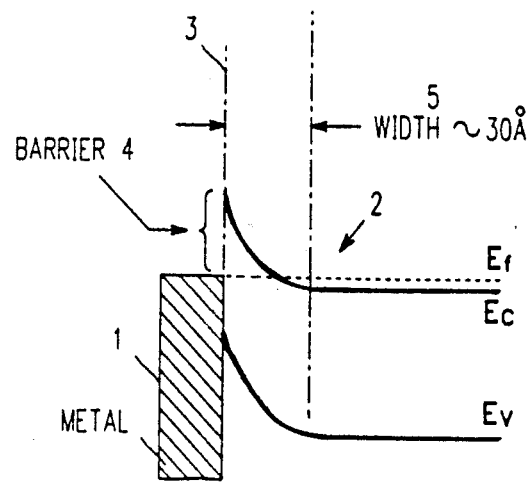
FIG. 1 is an energy level diagram illustrating the physical requirements of the ohmic contact of the invention.

Referring to FIG. 1, the ohmic contact of the invention is functionally described in connection with an energy level diagram which shows the energy band relationships in the intermetallic semiconductor crystal. As has been well known in the art when a metal electrode 1 is placed on the surface of an intermetallic semiconductor crystal 2, the Fermi level $E_F$ is pinned at the surface 3 and a barrier 4 is present to impede current flow. The conduction $E_C$ and valence $E_V$ bands change with depth into the crystal 2 from the interface 3 and the distance over which the change takes place is the barrier width 5 and is known in the art as the depletion width. Heretofore in the art, a depletion width 5 of about 100 Angstroms would yield a contact resistance of about $10^{-4}$ ohm cm². However, this value is considered much too large for high speed device applications. At this point in the art, $2 \times 10^{-6}$ ohm cm² is considered by circuit designers to be an approximate upper limit for useful contact resistance.

In accordance with the invention a contact with resistance of $1 \times 10^{-6}$ ohm cm² is achieved by providing a net donor concentration of $7 \times 10^{19}$/cc over a short distance so that a barrier or depletion width of approximately 30 Angstroms is achieved. The net donor concentration is the total donor concentration minus the total acceptor concentration.

For purposes and ease of explanation, the description will be provided with respect to the material GaAs using Si as the amphoteric dopant although in the light of the principles to be set forth one skilled in the art may readily make the transition to other intermetallic materials and other amphoteric dopants.

Under ordinary circumstances, the net donor concentration at the surface would not be sufficient to provide the extremely thin barrier required. The use of an amphoteric dopant coupled with pinned Fermi level conditions at the surface as the crystal is grown, causes a larger than expected fraction of dopant atoms to behave as donors within the surface depletion width. Since the barrier is made thin by a donor concentration higher than the bulk donor concentration, a lower than usual ohmic contact resistance results.

The function of the surface Fermi level pinning is to cause a surface depletion region that will exhibit equilibrium properties significantly different from bulk crystal equilibrium. In this manner the net donor density in the surface depletion region is caused to substantially exceed the net bulk donor concentration. Furthermore, since it is at equilibrium, this higher net surface donor density is stable.

Because the band bending at the surface of the crystal during growth is about the same as the band bending following metallization, the contact resistance will remain stable. This is in contrast to contacts formed by transient techniques such as alloying or pulse beam processing.

Figure 2:
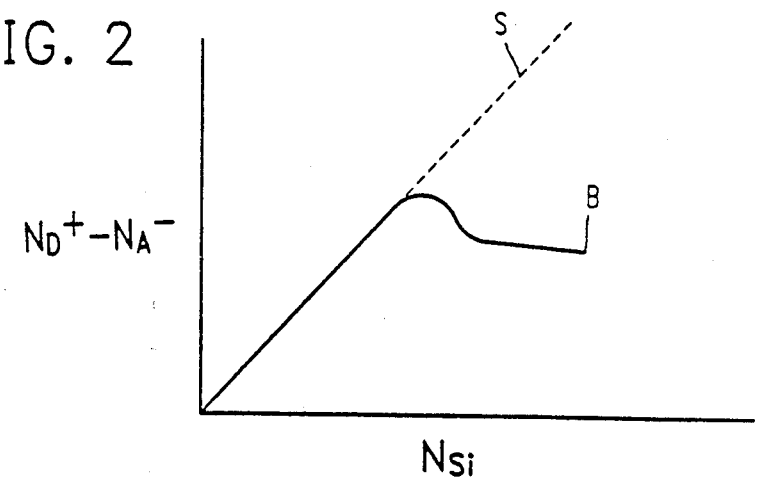
FIG. 2 is a graph of the net concentration of donors in the material with respect to the concentration of dopant in the material showing the changing concentration at the surface and in the bulk.

Referring next to FIG. 2 a graph is shown on logarithmic scale of the net number of donors labelled $N_D^+ - N_A^-$ vs. the total silicon concentration labelled $N_{Si}$. The solid curve in FIG. 2 labelled B represents the value achieved in the bulk. Curve B increases linearly until a maximum value which for GaAs, which has been grown by molecular beam epitaxy, is about $8 \times 10^{18}$/cc and would thereafter decrease. The dotted curve in FIG. 2 labelled S represents the equilibrium net donor concentration in the surface depletion region and increases in proportion to the total silicon concentration to at least $7 \times 10^{19}$/cc. This is far beyond the maximum bulk net donor density which is about $8 \times 10^{18}$/cc for molecular beam epitaxy growth and does not exceed $2 \times 10^{19}$/cc for silicon doping by any known growth technique. This proportionality is expected to extend to the silicon solubility limit of $2 \times 10^{20}$ atoms/cc.

Equation 1 represents the amphoteric behavior of the element silicon in bulk GaAs.

$$N_D^+/N_A^- = k(T) P_{As2} (n_i^2/n^2) \qquad \text{Equation 1}$$

where:
$N_D^+$ and $N_A^-$ are the ionized donor and acceptor concentrations whose sum equals the density of silicon in the GaAs,
$k(T)$ is a temperature-dependent constant,
$n_i$ is the intrinsic carrier concentration,
$n$ is the electron concentration, and
$P_{As2}$ is the arsenic overpressure.

In accordance with the invention, through the control of Fermi level pinning at the surface the expression $n_i^2/n^2$ is made constant independent of the dopant concentration. For the case of MBE this pinning is achieved by anion surface stabilization and this expression is nearly unity at the surface. The product of the other terms for MBE is approximately 3. Thus, for Fermi level pinning, the value of the $N_D^+/N_A^-$ is fixed by the value of $k(T)P_{As2}$.

For bulk equilibrium conditions equation 1 operates as follows. At low doping levels $n_i = n$; hence $n_i^2/n^2 = 1$, thus $N_D^+/N_A^-$ will be determined by the product $k(T)P_{As2}$ which for the growth of silicon doped bulk crystals is equal to about 55 and for MBE is somewhat lower. As the doping level is increased n becomes greater than $n_i$ this causes $N_D^+/N_A^-$ to approach unity which in turn causes the net donor concentration $N_D^+ - N_A^-$ to saturate. For silicon doped bulk crystals of GaAs the saturated concentration is about $1 \times 10^{19}$/cc and does not exceed $2 \times 10^{19}$/cc.

In accordance with the invention, through the control of the surface Fermi level $n_i^2/n^2$ is fixed at the surface and independent of the dopant concentration. This allows $N_D^+ - N_A^-$ in the surface depletion region to continue to be proportional to the dopant concentration for high dopant concentrations. For MBE the Fermi level is pinned so that $N_D^+/N_A^-$ is 3 or greater as is shown in FIG. 2.

Thus, in accordance with the invention, ohmic contact resistance in intermetallic semiconductors can be reduced due to its dependence upon surface charge density and not upon bulk carrier density. Even though bulk carrier densities saturate due to amphotericity, the surface space-charge layer will continue to shrink in thickness as its charge density increases. Ohmic contact resistance therefore will continue to drop despite a saturation or drop in n if contact is made to this depletion layer. This low contact resistance can be achieved by high amphoteric dopant atom concentration, surface Fermi level pinning, and metallization of the unoxidized surface by any of the standard semiconductor growth techniques such as molecular beam epitaxy, vapor phase epitaxy and liquid phase epitaxy.

BEST MODE FOR CARRYING OUT THE INVENTION

The conditions of the invention are preferably achieved by growth of the crystal with an amphoteric dopant under the pinned surface Fermi level conditions encountered in molecular beam epitaxial growth of GaAs under an As overpressure. To form the contact a layer of GaAs is grown at the rate of 1 µm/hr. for ½ hour at 550° C. doped with Si at $1 \times 10^{20}$ cm$^{-3}$. The bulk electron density is $5 \times 10^{18}$ cm$^{-3}$. If the surface $N_D^+ - N_A^-$ were at the level indicated by the electron concentration, the contact resistance through a 0.8 eV barrier would be $2 \times 10^{-2}$ Ω-cm², useless for most applications. The surface was metallized with Ag in situ to avoid air oxidation of the thin surface layer that contained the high $N_D^+ - N_A^-$ donor population. The contact resistance was determined to be $1.1 \times 10^{-6}$ Ω-cm² indicating that $N_D^+ - N_A^-$ in the surface layer is about $7 \times 10^{19}$ cm$^{-3}$ giving $N_D/N_A \sim 6$. This indicates that the donor-rich surface layer is approximately 30 Angstroms thick which is very thin and must be protected from air oxidation prior to metallization if low contact resistance is to be obtained.

To emphasize the effect of air oxidation of the donor-rich surface, consider a layer of GaAs grown at the rate of 1 µm/hr. at 600° C. doped with silicon at a level of $5 \times 10^{19}$ cm$^{-3}$. The bulk electron concentration is $5 \times 10^{18}$ cm$^{-3}$. Cr, when evaporated as the contact material following air exposure produces nonalloyed ohmic contacts to the layer with a contact resistance of $2.2 \times 10^{-5}$ Ω-cm², whereas similar layers metallized will yield contact resistances of $5 \times 10^{-6}$-Ωcm² illustrating the thinness of the layer and the deleterious effect of air exposure.

What has been described is a very low resistivity ohmic contact to intermetallic semiconductor materials wherein an amphoteric dopant is caused to occupy a disproportionately large number of donor sites in a very narrow region at the surface.

Having thus described our invention, what we claim as new and desire to secure by Letters Patent is:

1. An ohmic electrical device connection comprising in combination
   a first region in a group III-V intermetallic semiconductor crystal having a carrier density in the bulk thereof below $2 \times 10^{19}$/cc,
   a barrier region between 20 and 50 Angstroms in thickness positioned in a surface of said first region, said barrier region containing an amphoteric conductivity type determining impurity having a net donor carrier density of above $5 \times 10^{19}$/cc and
   a metal in contact with said barrier region in said surface.

2. The ohmic contact of claim 1 where said intermetallic semiconductor is Gallium Arsenide.

3. The ohmic contact of claim 2 where said impurity is at least one member of the group of Ge and Si.

4. An ohmic contact to a group III-V intermetallic semiconductor crystal comprising in combination p1 a surface region containing an amphoteric impurity exhibiting a net donor density above $5 \times 10^{19}$/cc and a width from the surface to a region of lower net donor density in the range of 20-50 Angstroms, and
   a metal layer in contact with said surface region.

5. The ohmic contact of claim 8 wherein said crystal is GaAs, said amphoteric dopant is at least one of Si, Ge and said surface region has a net donor density of above $5 \times 10^{19}$ and said surface region is in the range of 20-50 Angstroms thick.

6. In an ohmic contact to a group III-V intermetallic semiconductor crystal of the type wherein a barrier region at the interface of said crystal and a metal is sufficiently thin to permit quantum mechanical tunneling, the improvement comprising
   said barrier region having a thickness in the range of 20 to 50 Angstroms and
   said barrier region containing an amphoteric dopant on both donor and acceptor sites in different sublattices of said crystal exhibiting thereby a net donor density of $5 \times 10^{19}$ and above, said net donor density being higher than the net donor density in the bulk of said crystal.

7. The ohmic contact of claim 6 wherein said crystal is GaAs and said dopant is at least one member of the group of Si and Ge.

* * * * *